(12) United States Patent
Miyazaki

(10) Patent No.: US 11,703,553 B2
(45) Date of Patent: Jul. 18, 2023

(54) MAGNETIC FIELD ANALYSIS DEVICE, ANALYSIS METHOD, AND COMPUTER READABLE MEDIUM STORING PROGRAM

(71) Applicant: SUMITOMO HEAVY INDUSTRIES, LTD., Tokyo (JP)

(72) Inventor: Shuji Miyazaki, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 336 days.

(21) Appl. No.: 17/012,682

(22) Filed: Sep. 4, 2020

(65) Prior Publication Data

US 2020/0400757 A1 Dec. 24, 2020

Related U.S. Application Data

(63) Continuation of application No. PCT/JP2018/041831, filed on Nov. 12, 2018.

(30) Foreign Application Priority Data

Mar. 7, 2018 (JP) ................. 2018-040400

(51) Int. Cl.
*G01R 33/02* (2006.01)
*G01N 27/72* (2006.01)
(Continued)

(52) U.S. Cl.
CPC ............. *G01R 33/02* (2013.01); *G01N 27/72* (2013.01); *G01R 33/12* (2013.01); *G01R 33/0023* (2013.01)

(58) Field of Classification Search
None
See application file for complete search history.

(56) References Cited

U.S. PATENT DOCUMENTS 6,662,125 B2    12/2003 Namiki
8,280,699 B2    10/2012 Ichishima et al.
(Continued)

FOREIGN PATENT DOCUMENTS

JP    2003-006181 A    1/2003
JP    2009-037334 A    2/2009
(Continued)

OTHER PUBLICATIONS

Kitagawa Isao ; Magnetic Property Calculation Method, Magnetization Motion Visualization Device, And Program Therefor; JP 5877096 B2; Hitachi LTD +; Date Published Mar. 2, 2016 (Year: 2016).*

(Continued)

*Primary Examiner* — Nasima Monsur
(74) *Attorney, Agent, or Firm* — Michael Best & Friedrich LLP

(57) ABSTRACT

A magnetic field analysis device includes a magnetization application unit that divides a virtual space into a plurality of volume elements and applies magnetization to each of the volume elements, and a magnetic field calculation unit that calculates, on each of a plurality of observation points in the virtual space, based on the magnetization applied to a plurality of the volume elements around the observation point, a magnetic field generated at the observation point for each volume element and obtains a magnetic field generated at each of the plurality of the observation points based on a calculation result of each of the plurality of the volume elements.

12 Claims, 10 Drawing Sheets

(51) Int. Cl.
*G01R 33/12* (2006.01)
*G01R 33/00* (2006.01)

(56) References Cited

U.S. PATENT DOCUMENTS 10,379,081 B2 8/2019 Miyazaki et al.
2017/0285123 A1* 10/2017 Kaditz ............... G01R 33/5608

FOREIGN PATENT DOCUMENTS

| JP | 2015-111401 A | 6/2015 |
|----|---------------|--------|
| JP | 2017-194884 A | 10/2017 |

OTHER PUBLICATIONS

International Search Report issued in Application No. PCT/JP2018/041831, dated Jan. 29, 2019.

* cited by examiner

MAGNETIC FIELD ANALYSIS DEVICE, ANALYSIS METHOD, AND COMPUTER READABLE MEDIUM STORING PROGRAM

RELATED APPLICATIONS

The contents of Japanese Patent Application No. 2018-040400, and of International Patent Application No. PCT/JP2018/041831, on the basis of each of which priority benefits are claimed in an accompanying application data sheet, are in their entirety incorporated herein by reference.

BACKGROUND

Technical Field

Certain embodiments of the present invention relate to a magnetic field analysis device, an analysis method, and a computer readable medium storing a program.

Description of Related Art

In recent years, with improvement of processing ability of a computer, a simulation that incorporates magnetic field analysis is performed in a field of design and development of electric appliances, such as a motor. Since the simulation enables a certain degree of evaluation without actually producing a prototype, a speed of design and development can be improved.

A simulation based on a renormalized molecular dynamics method that is a developed version of a molecular dynamics method to handle a macro scale system is known as a method for researching phenomena of general material science using a computer based on classical mechanics, quantum mechanics, or the like (for example, the related art). Since a particle method, such as the molecular dynamics method, handles not only a static phenomenon but also a dynamic phenomenon, such as flow, the particle method attracts attention as a simulation method replacing a finite element method, which primarily analyzes a static phenomenon, or the like.

SUMMARY

According to an embodiment of the invention, there is provided a magnetic field analysis device including: a magnetization application unit that divides a virtual space into a plurality of volume elements and applies magnetization to each of the volume elements; and a magnetic field calculation unit that calculates, on each of a plurality of observation points in the virtual space, based on the magnetization applied to a plurality of the volume elements around the observation point, a magnetic field generated at the observation point for each volume element and obtains a magnetic field generated at each of the plurality of the observation points based on a calculation result of each of the plurality of the volume elements, in which the magnetization application unit is configured to divide the virtual space into a plurality of voxels having the same shape and dimension, apply magnetization to each of the plurality of the voxels, perform coarse graining for collecting a plurality of the continuous voxels in a first direction to one volume element to make dimension relating to the first direction greater than dimension relating to another second direction on at least a part of the volume elements, and apply magnetization to each of the coarse-grained volume elements based on the magnetization applied to the plurality of the voxels included in each of the coarse-grained volume elements.

According to another embodiment of the invention, there is provided a magnetic field analysis method including: dividing a virtual space into a plurality of volume elements and applying magnetization to each of the volume elements; and computing a magnetic field generated at each of a plurality of observation points in the virtual space by the magnetization applied to the volume elements for each volume element and obtaining a magnetic field generated at each of the plurality of the observation points based on a computation result of each of the plurality of the volume elements, in which, in dividing the virtual space into the plurality of volume elements and applying magnetization to each of the volume elements, the virtual space is divided into a plurality of voxels having the same shape and dimension, magnetization is applied to each of the plurality of voxels, coarse graining for collecting a plurality of the continuous voxels in a first direction to one volume element is performed to make dimension relating to the first direction in the virtual space greater than dimension relating to another second direction on at least a part of the volume elements, and magnetization is applied to each of the coarse-grained volume elements based on the magnetization applied to the plurality of the voxels included in each of the coarse-grained volume elements.

According to still another aspect of the invention, there is provided a computer readable medium storing a program that causes a computer to realize: a function of dividing a virtual space into a plurality of volume elements and applying magnetization to each of the volume elements; a function of computing a magnetic field generated at each of a plurality of observation points in the virtual space by the magnetization applied to the volume elements for each volume element and obtaining a magnetic field generated at each of the plurality of the observation points based on a computation result of each of the plurality of the volume elements; and a function of, in dividing the virtual space into the volume elements, making dimension relating to a first direction in the virtual space greater than dimension relating to another second direction on at least a part of the volume elements, in which the function of dividing the virtual space into the plurality of volume elements and applying the magnetization to each of the volume elements includes a function of dividing the virtual space into a plurality of voxels having the same shape and dimension, applying magnetization to each of the plurality of voxels, performing coarse graining for collecting a plurality of the continuous voxels in a first direction to one volume element to make dimension relating to the first direction greater than dimension relating to another second direction on at least a part of the volume elements, and applying magnetization to each of the coarse-grained volume elements based on the magnetization applied to the plurality of the voxels included in each of the coarse-grained volume elements.

DETAILED DESCRIPTION

Figure 1:
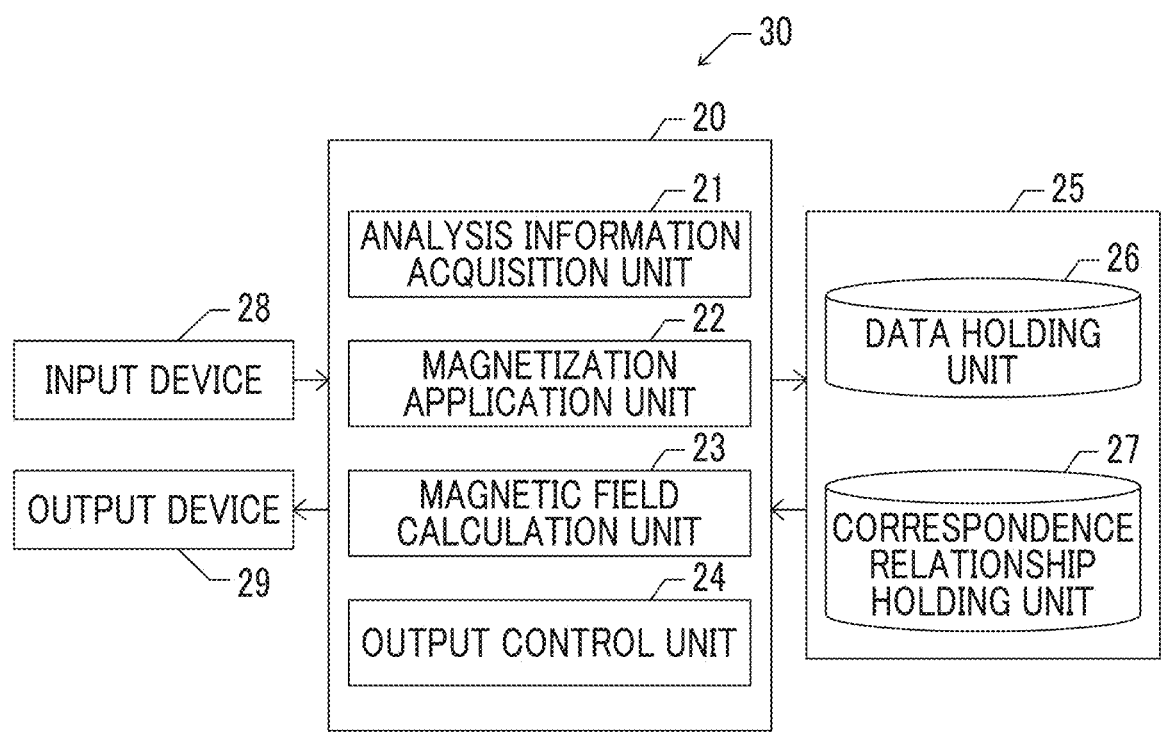
FIG. 1 is a block diagram of a magnetic field analysis device according to an embodiment.

For example, a magnetic bead method that can obtain a simulation result with comparatively high accuracy at a high speed by applying a magnetic moment to each particle and calculating a magnetic physical quantity using an exact solution based on spherical symmetry of each particle has been suggested (for example, the related art). In the magnetic bead method, an object is divided into a plurality of elements, and calculation is performed using an exact solution based on spherical symmetry on an assumption that each element is a spherical particle. In this case, in a case where the object is represented by an aggregate of a plurality of particles, a gap occurs between the particles, and an error due to the gap or the spherical particles may occur. In order to increase computation accuracy, there is a need to divide the object into voxels, such as a cube, with no gap, and to execute surface integration based on an exact solution according to the shape of the voxels. In a case where surface integration is to be performed with high accuracy, a computation time becomes enormous.

A method capable of achieving reduction in computation time of magnetic field calculation has been suggested (for example, the related art). In this method, a numerical solution of a magnetic field generated by a reference particle, to which a magnetic moment is applied, is calculated in advance for each of a plurality of lattice points set around the reference particle, and a correspondence relationship between a vector quantity of the magnetic moment applied to the reference particle and the numerical solution of the magnetic field is held for each lattice point. A magnetic field generated by each particle, to which a magnetic moment is applied, is calculated using the correspondence relationship. Since there is no need to perform computation of surface integration each time the magnetic field generated by each particle is computed, it is possible to reduce a computation time.

There is demand for a method that further reduces a computation time. It is desirable to provide a magnetic field analysis device, an analysis method, and a computer readable medium storing a program capable of further reducing a computation time.

The volume element is made to have the dimension relating to the first direction greater than the dimension in the second direction, whereby the number of volume elements becomes smaller than the number of regular hexahedron voxels of which the length of one side is the dimension of the volume element in the second direction. For this reason, in a case where calculation is performed for each volume element, a calculation load becomes low compared to a case where calculation is performed for each voxel. Furthermore, in a case where a direction in which a spatial change of the magnetic field is moderate is selected to the first direction, it is possible to suppress degradation of computation accuracy.

A simulation based on a molecular dynamics method (hereinafter, referred to as an MD method), a quantum molecular dynamics method, or a renormalized molecular dynamics method (hereinafter, referred to as an RMD method) that is a developed version of the MD method to handle a macro scale system is known as a method for researching phenomena of general material science using a computer based on classical mechanics, quantum mechanics, or the like. To be precise, the MD method or the RMD method is a kinetic method (statistical mechanics is used in calculation of a physical quantity), and the particle method is a method that discretizes a differential equation describing a continuum. While both are different, here, the MD method or the RMD method is referred to as the particle method.

Since the particle method can handle not only a static phenomenon but also a dynamic phenomenon, such as flow, the particle method attracts attention as a simulation method replacing a finite element method, which primarily analyzes a static phenomenon, or the like.

The particle method has a differential point of view that a particle system to be analyzed is obtained by discretizing a continuum by particles. For example, when a fluid is handled in the particle method, it is often the case that the Navier-Stokes equation is discretized by particles.

On the other hand, as another point of view, the particle method also has an integration point of view that a continuum is formed by collecting many particles. This is, for example, a point of view that a large iron ball is formed by collecting and solidifying small iron particles.

In general, in a case of obtaining a magnetic field at a certain point (observation point) in a space where many magnetic moments exist, the magnetic field generated at the observation point by each magnetic moment is summed up over the magnetic moments due to a superposition principle. The inventors have originally found affinity between the method that obtains the magnetic field from a collection of magnetic moments and the particle method in the integration point of view, and have devised the application of a magnetic moment to a particle in the particle method. With this, it is possible to broaden the cover range of the particle method to magnetic field analysis while maintaining the advantage of the particle method that the particle method is effective for analysis of convection or large displacement.

An object is represented by an aggregate of spherical particles, and an exact solution based on spherical symmetry of each particle, whereby it is possible to obtain a calculation result at high speed and with high accuracy. However, in a case where an object that is a continuum is represented by an aggregate of spherical particles, a gap occurs between the particles, and a computation error due to the gap occurs. In particular, there is a greater influence of an error in computation of a magnetic field near a particle in a case where a distance between particles is smaller. In order to increase computation accuracy, it is preferable that an object is divided into voxels, such as a cube or a Voronoi polyhedron, and the object is divided into the voxels with no gap. In this case, there is a need to execute surface integration on each voxel in order to obtain the magnetic field. In executing the surface integration, a computation time becomes enormous.

In a magnetic field analysis device according to an embodiment described below, it is possible to achieve reduction in computation time.

FIG. 1 is a block diagram of a magnetic field analysis device 30 according to the embodiment. The magnetic field analysis device 30 according to the embodiment includes a processing device 20, a storage device 25, an input device 28, and an output device 29. The processing device 20 includes an analysis information acquisition unit 21, a magnetization application unit 22, a magnetic field calculation unit 23, and an output control unit 24. The storage device 25 includes a data holding unit 26 and a correspondence relationship holding unit 27.

Each block shown in FIG. 1 can be realized by hardware, for example, an element, such as a central processing unit (CPU) of a computer, or a mechanical device or may be realized by software, for example, a computer program or the like. In FIG. 1, functional blocks that are realized by cooperation of hardware and software are shown. Accordingly, the functional blocks can be realized by a combination of hardware and software in various aspects.

The processing device 20 is connected to the input device 28 and the output device 29. The input device 28 receives an input of a command from a user and data related to processing, which is executed by the processing device 20. As the input device 28, for example, a keyboard or a mouse that performs the input by a user's operation, a communication device that performs the input through a network, such as the Internet, a reading device that performs the input from a recording medium, such as a CD or a DVD, or the like can be used.

The analysis information acquisition unit 21 acquires magnetic field analysis information through the input device 28. In the magnetic field analysis information, various kinds of information necessary for magnetic field analysis are included. For example, a shape of an object to be analyzed defined in a virtual space, information for dividing the object to be analyzed into voxels, information for coarse graining of the voxels, information for defining a direction in which a spatial change of a magnetic field in the virtual space is relatively moderate, and the like are included.

The magnetization application unit 22 divides the object in the virtual space into a plurality of voxels (regular hexahedron elements) based on the magnetic field analysis information. A voxel identifier (voxel ID) for specifying one voxel 50 is provided to each voxel 50.

Figure 2B:
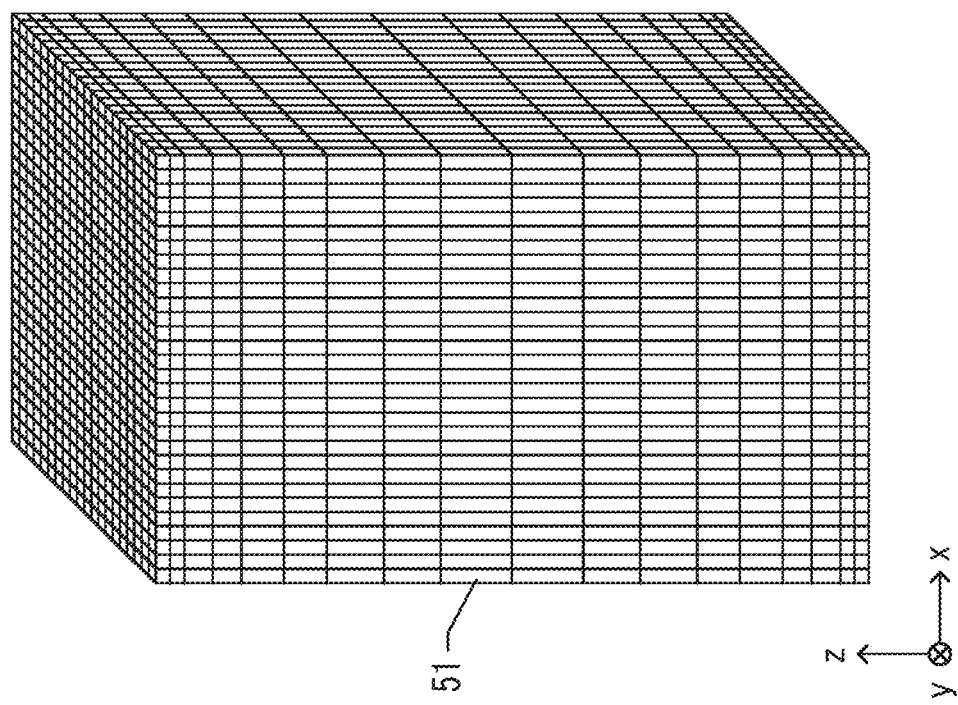
FIG. 2B is a perspective view of a portion of the object after coarse graining.
Figure 2A:
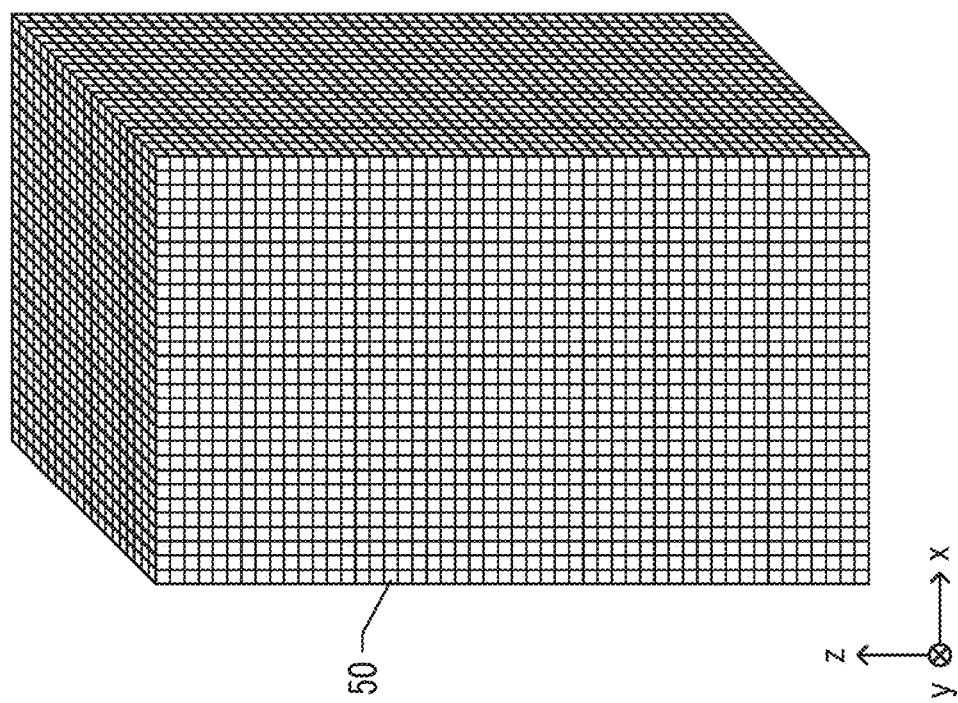
FIG. 2A is a perspective view of a state in which a portion of an object is divided into a plurality of voxels.

FIG. 2A is a perspective view of a state in which a portion of an object is divided into a plurality of voxels 50. A plurality of voxels 50 are arranged in an x-axis direction, a y-axis direction, and a z-axis direction. The shape and dimension of a plurality of voxels 50 are the same, and a plurality of voxels 50 have a simple cubic unit cell structure. In the embodiment, an example where a change of the magnetic field relating to the z-axis direction is relatively moderate, and changes of the magnetic field relating to the x-axis direction and y-axis direction are relatively steep will be described. Here, in the magnetic field, an external magnetic field and a magnetic field generated by magnetization of the object are included.

In addition, the magnetization application unit 22 (FIG. 1) applies magnetization to each voxel 50. The magnetization may be applied as an initial condition or the magnetization generated in each voxel 50 may be computed based on a magnetic field obtained by the magnetic field calculation unit 23 described below and the magnetization obtained by computation may be applied. Since the magnetization is a value per unit volume of a vector sum of all magnetic moments in the voxel 50, the application of one value to the voxel 50 as the magnetization is substantially the same as application of a value of one of the magnetic moments to the voxel 50. The magnetization application unit 22 registers the applied magnetization in the data holding unit 26 in association with the voxel ID.

In addition, the magnetization application unit 22 collects a plurality of continuous voxels 50 in the direction (in the embodiment, the z-axis direction), in which the spatial change of the magnetic field is moderate, to one volume element 51. Processing of collecting a plurality of voxels 50 to one volume element 51 is referred to as coarse graining. Each of the coarse-grained volume elements 51 is made to have the dimension in the z-axis direction greater than the dimension in the x-axis direction and the y-axis direction.

FIG. 2B is a perspective view of a portion of the object after coarse graining. A plurality of voxels 50 (FIG. 2A) arranged in the z-axis direction are coarse-grained (collected) to form the volume element 51. The number of voxels 50 coarse-grained in one volume element 51 may be set according to the degree of change of the magnetic field. For example, as the change of the magnetic field is more moderate, the number of voxels 50 coarse-grained in one volume element 51 may be greater. In FIG. 2B, an example where the change of the magnetic field in the z-axis direction is moderate near a center portion in an up-down direction, and the change of the magnetic field becomes gradually large toward upper and lower ends is shown. For this reason, the number of voxels 50 coarse-grained in one volume element 51 near the center portion in the up-down direction is made relatively large, and the number of voxels 50 coarse-grained in one volume element 51 is made relatively small toward the upper and lower ends.

The magnetization application unit 22 (FIG. 1) applies magnetization each of the volume elements 51 based on the magnetization applied to the original voxels 50. For example, a vector mean of the magnetization applied to the original voxels 50 coarse-grained in one volume element 51 may be applied to the volume element 51. The magnetization application unit 22 registers the magnetization applied to the volume element 51 in the data holding unit 26 in association with a volume element identifier (volume element ID).

The magnetic field calculation unit 23 (FIG. 1) computes a magnetic field at each of a plurality of observation points in the virtual space based on the magnetization applied to the voxels 50 or the magnetization applied to the volume element 51 and registers a computation result in the data holding unit 26. The voxel 50 or the volume element 51 that has the magnetization to be a base resulting in the magnetic field at the observation point is referred to as a source. The observation point is disposed, for example, a center position of each of the volume element 51. The magnetic field calculation unit 23 includes three kinds of functions of computing the magnetic field. A first function (table reference system) is suitable for computation when a distance between the source and the observation point is short, and uses a correspondence relationship registered in the correspondence relationship holding unit 27. A second function (dipole approximation system) is suitable for computation when the distance between the source and the observation point is long. A third function (iterated integration system) is suitable for computation when the observation point is close to the source. The details of the first function to the third function will be described below in detail.

The output control unit 24 (FIG. 1) outputs an analysis result, for example, the computation result of the magnetic field of each observation point registered in the data holding unit 26 to the output device 29.

First Function (Table Reference System)

Next, the first function (table reference system) of the magnetic field calculation unit 23 will be described referring to FIGS. 3A to 4.

Figure 3A:
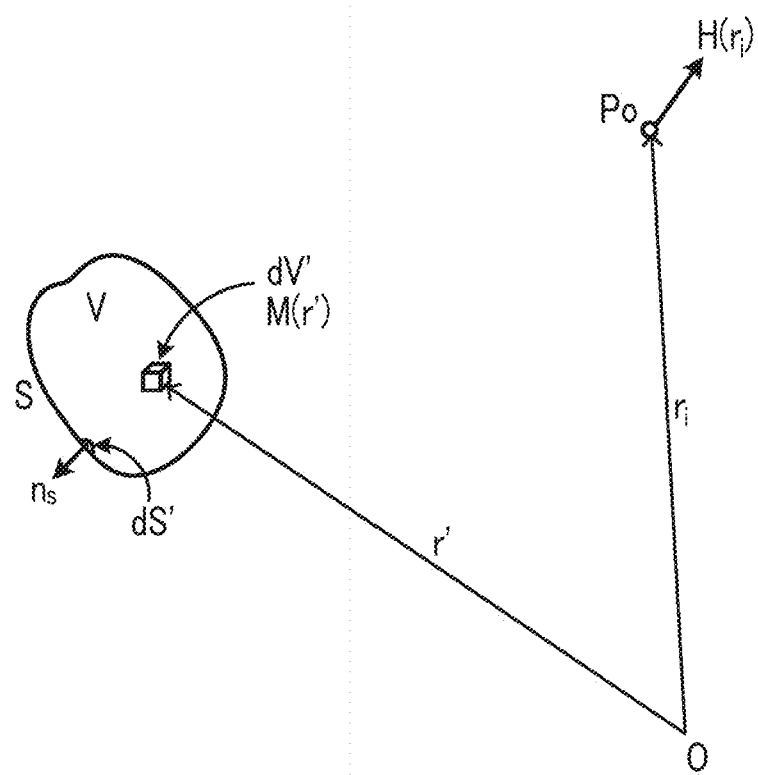
FIG. 3A is a diagram showing a coordinate system that is defined in a virtual space.

FIG. 3A is a diagram showing a coordinate system that is defined in the virtual space. The origin of the coordinate system is represented by O, and a position of an observation point Po in the virtual space is represented by $r_i$. A position of a microvolume dV' is represented by r'. Here, a bold character means a vector. A magnetic field $H(r_i)$ at the observation point Po is obtained by integrating a magnetic field generated by magnetization M(r') of the microvolume dV' over the entire space and is represented by the following expression.

$$H(r_i) = -\frac{1}{4\pi} \int\int\int \frac{\nabla' \cdot M(r')}{|r_i - r'|^3} (r_i - r') dV' \qquad (1)$$

Here, $\nabla'$ means differentiation at the position r'.

In a case where a region where a magnetic material is distributed is represented by V, and a surface is represented by S, Expression (1) can be divided into terms of volume integration and surface integration as described below.

$$H(r_i) = \qquad (2)$$
$$-\frac{1}{4\pi} \int\int\int_V \frac{\nabla' \cdot M(r')}{|r_i - r'|^3}(r_i - r') dV' + \frac{1}{4\pi} \int\int_S \frac{n_s \cdot M(r')}{|r_i - r'|^3}(r_i - r') dS'$$

Here, dS' is a micro region of a surface of the region where the magnetic material is distributed, and a vector $n_s$ is a unit normal vector of the surface S.

Figure 3B:
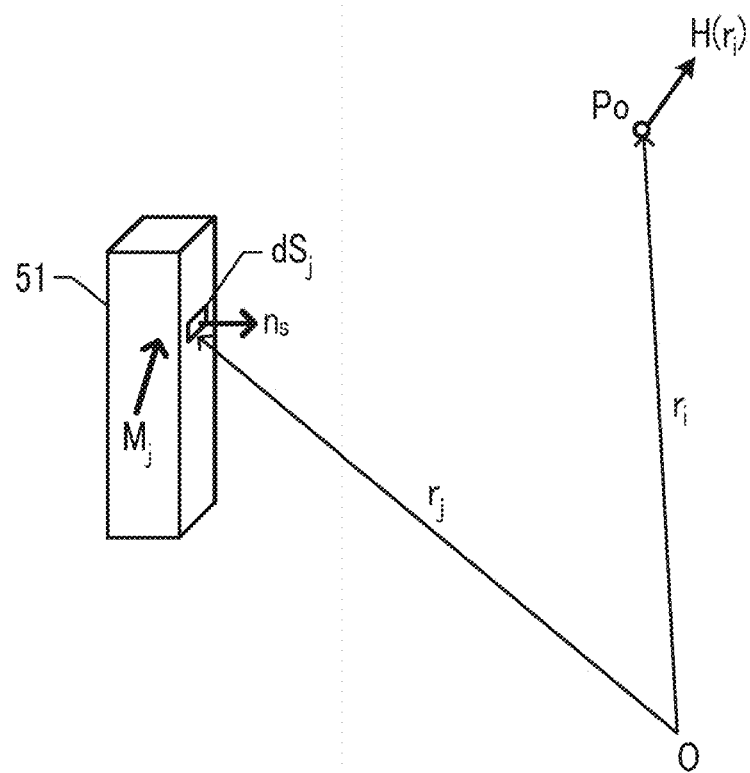
FIG. 3B is a diagram illustrating a method that, when magnetization inside one volume element is constant, computes a magnetic field $H(r_i)$ generated at an observation point by the magnetization of the volume element.

FIG. 3B is a diagram illustrating a method that, when the magnetization inside one volume element 51 is constant, computes the magnetic field $H(r_i)$ generated at the observation point Po by the magnetization applied to the volume element 51. Magnetization applied to a j-th volume element 51 (position $r_j$) is represented by $M_j$. A micro region of a surface of the volume element 51 is represented by $dS_j$, and a unit normal vector of the micro region $dS_j$ is represented by $n_s$.

Expression (2) is modified, and the magnetic field $H(r_i)$ generated at the observation point Po of the position $r_i$ is represented by the following expression.

$$H(r_i) = \frac{1}{4\pi} \sum_j^N \int\int_{S_j} \frac{(n_s \cdot M_j) r_{ij}}{|r_{ij}|^3} dS_j \qquad (3)$$

$$r_{ij} = r_i - r_j$$

Here, $r_j$ represents the position of the micro region dS'. Σ relating to a parameter j means that a sum on N volume elements 51 is taken. The surface integration relating to the surface $S_j$ means that surface integration is performed over the entire region of the surface for each volume element 51.

Figure 4:
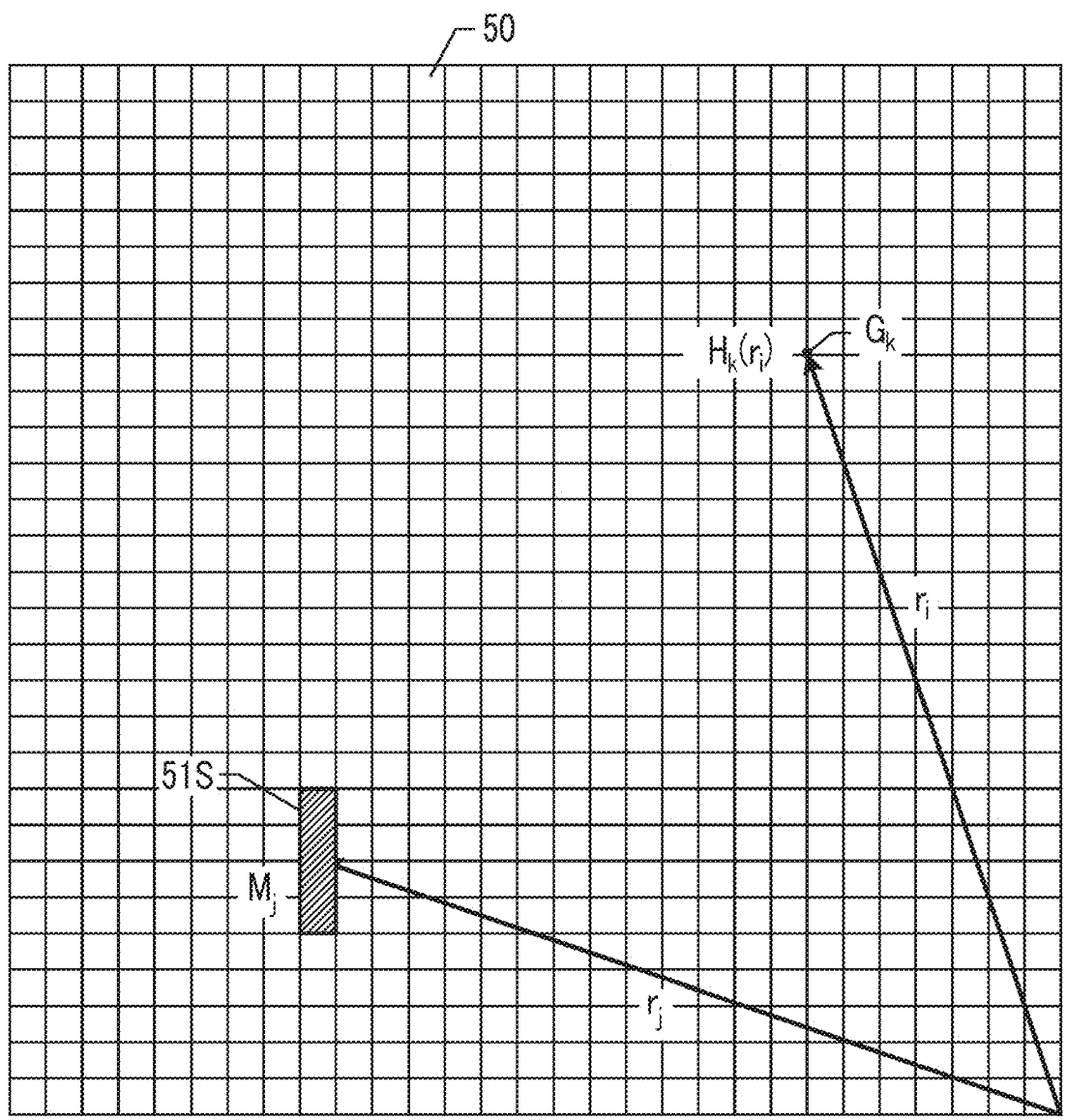
FIG. 4 is a diagram showing a positional relationship between a volume element to be a source point and a plurality of reference points around the volume element.

FIG. 4 is a diagram showing a positional relationship between a volume element 51S to be a source and a plurality of reference points $G_k$ around the volume element 51S. In FIG. 4, an example where the volume element 51S to be a source includes four continuous voxels 50 is shown. In the embodiment, in order to increase the speed of calculation processing of the surface integration of Expression (3), a correspondence relationship between magnetization $M_j$ of one volume element 51S to be a source and a magnetic field $H_k(r_i)$ generated at each of a plurality of reference point $G_k$ (position $r_i$) is calculated in advance by executing the surface integration on the surface of the volume element 51S. The reference point $G_k$ is disposed, for example, corresponding to a position of a vertex of each of a plurality of voxels 50.

The magnetic field $H_k(r_i)$ generated at the reference point $G_k$ by the magnetization $M_j$ of the volume element 51S (position $r_i$) to be a source can be represented as follows from Expression (3).

$$H_k(r_i) = \frac{1}{4\pi} \int\int_{S_j} \frac{(n_s \cdot M_j) r_{ij}}{|r_{ij}|^3} dS_j \qquad (4)$$

Here, the surface integration means surface integration on the entire region of the surface of the volume element 51S.

The magnetic field $H_k(r_i)$ represented by Expression (4) is an exact solution using the surface integration. Here, in a case where Expression (4) can be modified and represented as Expression (5) described below using a tensor $T_k$, which determines the correspondence relationship between the magnetic field $H_k(r_i)$ and the magnetization $M_j$, it is possible to easily compute the magnetic field $H_k(r_i)$ generated at each reference point $G_k$ by the volume element 51 having any magnetization $M_j$.

$$H_k(r_i) = T_k M_j = \begin{pmatrix} T_{k,xx} & T_{k,xy} & T_{k,xz} \\ T_{k,yx} & T_{k,yy} & T_{k,yz} \\ T_{k,zx} & T_{k,zy} & T_{k,zz} \end{pmatrix} \begin{pmatrix} M_{j,x} \\ M_{j,y} \\ M_{j,z} \end{pmatrix} \qquad (5)$$

Each element of the tensor $T_k$ can be represented as follows.

$$T_{k,xx} = \frac{1}{4\pi} \int\int_{S_j} \frac{n_x x_{ij}}{|r_{ij}|^3} dS_j \qquad (6)$$

$$T_{k,xy} = \frac{1}{4\pi} \int\int_{S_j} \frac{n_y x_{ij}}{|r_{ij}|^3} dS_j$$

-continued $$T_{k,xz} = \frac{1}{4\pi} \int\int_{S_j} \frac{n_z x_{ij}}{|r_{ij}|^3} dS_j$$

$$T_{k,yx} = \frac{1}{4\pi} \int\int_{S_j} \frac{n_x y_{ij}}{|r_{ij}|^3} dS_j$$

$$T_{k,yy} = \frac{1}{4\pi} \int\int_{S_j} \frac{n_y y_{ij}}{|r_{ij}|^3} dS_j$$

$$T_{k,yz} = \frac{1}{4\pi} \int\int_{S_j} \frac{n_z y_{ij}}{|r_{ij}|^3} dS_j$$

$$T_{k,zx} = \frac{1}{4\pi} \int\int_{S_j} \frac{n_x z_{ij}}{|r_{ij}|^3} dS_j$$

$$T_{k,zy} = \frac{1}{4\pi} \int\int_{S_j} \frac{n_y z_{ij}}{|r_{ij}|^3} dS_j$$

$$T_{k,zz} = \frac{1}{4\pi} \int\int_{S_j} \frac{n_z z_{ij}}{|r_{ij}|^3} dS_j$$

Here, $n_x$, $n_y$, and $n_z$ are an x component, a y component, and a z component of the unit normal vector $n_s$, respectively. $x_{ij}$, $y_{ij}$, and $z_{ij}$ are an x component, a y component, and a z component of a vector $r_{ij}$ with the micro region $dS_j$ of the volume element 51S to be a source as a start point and the reference point $G_k$ as an end point.

In the embodiment, for the volume element 51S to be a source, surface integration of Expression (6) is executed on a plurality of reference points $G_k$, and the tensor $T_k$ is calculated in advance on a plurality of reference points $G_k$. The tensor $T_k$ indicates a correspondence relationship between the magnetization $M_j$ applied to the volume element 51S to be a source and a magnetic field $H_k$ generated at each of a plurality of reference points $G_k$ by the magnetization $M_j$. The correspondence relationship is prepared for each relative position of the volume element 51S to be a source and the observation point. In addition, the tensor $T_k$ indicating the correspondence relationship is prepared for each size of the volume element 51 (FIG. 2B). For example, in a case where the maximum number of voxels 50 to be coarse-grained is set to ten, the tensor $T_k$ is prepared for each of a case where the number of coarse-grained voxels is one to a case where the number of coarse-grained voxels is ten.

The tensor $T_k$ indicating the correspondence relationship is stored in the correspondence relationship holding unit 27 (FIG. 1). An example of a specific method that computes the tensor $T_k$ in advance is described in the related art. A method that executes the surface integration of Expression (6) in advance is not limited to the example described in the related art.

The magnetic field $H(r_i)$ at the observation point Po (FIG. 3B) of the position $r_i$ can be calculated by averaging the magnetic fields $H_k$ of the reference points $G_k$ corresponding to eight vertexes of the voxel 50 including the observation point Po.

The table reference system is used when the distance between the volume element 51S to be a source and the observation point Po is equal to or less than a certain reference distance. Accordingly, the tensor $T_k$ may be prepared on the reference point $G_k$ of which the distance from the volume element 51S to be a source is equal to or less than the reference distance. The number of reference points $G_k$ on which the tensor $T_k$ should be prepared is smaller than the number of volume elements 51 in the virtual space. For this reason, in a case where the table reference system in which the magnetic field is computed using the tensor $T_k$ indicating the correspondence relationship is applied, a calculation load becomes low, compared to a system in which the magnetic fields generated at the observation point Po (FIG. 3B) by all volume elements 51 are computed using surface integration every time.

In the table reference system, one volume element 51 after coarse graining becomes one source, and becomes one observation point. For this reason, in a case where n voxels 50 are collected to one volume element 51, both of the number of sources and the number of observation points become 1/n. Since the number of combinations of the sources and the observation points becomes $1/n^2$, a calculation time of a magnetic field substantially decreases in proportion to $n^2$.

Second Function (Dipole Approximation System)

Next, the second function (dipole approximation system) of the magnetic field calculation unit 23 (FIG. 1) will be described referring to FIG. 5.

Figure 5:
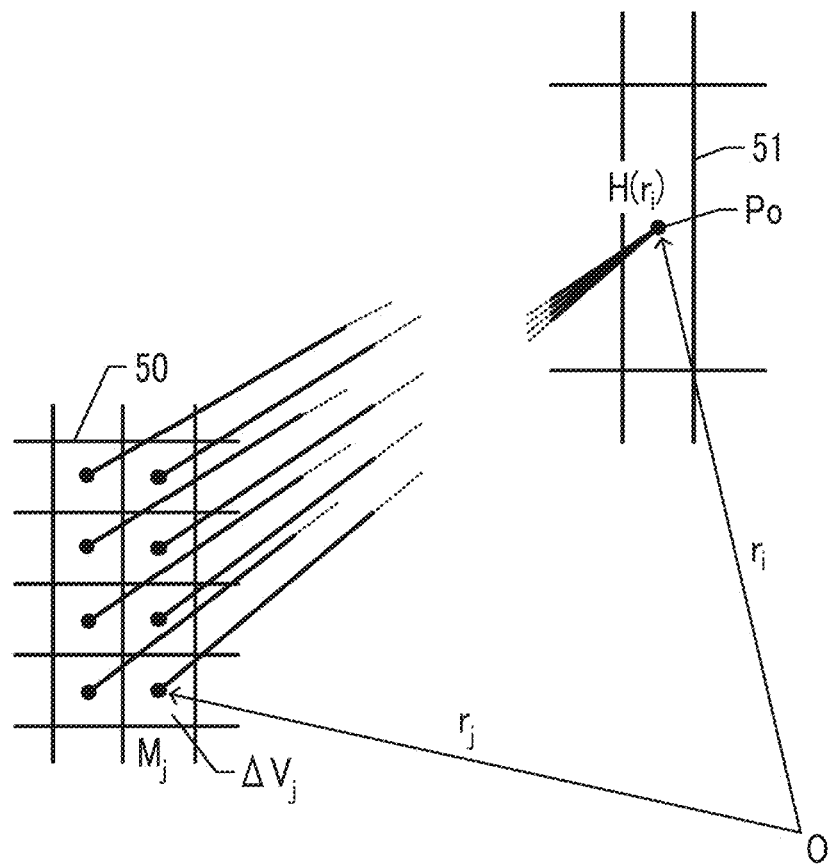
FIG. 5 is a diagram showing a positional relationship between a voxel to which magnetization is applied and an observation point.

FIG. 5 is a diagram showing a positional relationship between the voxel 50 to which magnetization is applied and the observation point Po. The observation point Po is set, for example, at the center of each of the volume elements 51. As a magnetization to be a base for computing a magnetic field, the magnetization applied to the voxel 50 before coarse graining is used.

In a case where Expression (1) is partially integrated and approximated, Expression (7) described below is obtained.

$$H(r_i) = \frac{1}{4\pi} \sum_{j=1}^{N} \frac{3(n_{ij} \cdot M_j)n_{ij} - M_j}{|r_{ij}|^3} \Delta V_j \quad (7)$$

$$r_{ij} = r_i - r_j$$

$$n_{ij} = \frac{r_{ij}}{|r_{ij}|}$$

The dipole approximation system is equivalent to obtaining a magnetic field while the magnetization M applied to the voxel 50 before coarse graining is represented by a magnetic dipole disposed at the center of the voxel 50. In a case where the volume of the voxel 50 is represented by $\Delta V_j$, a magnetic moment can be represented by $\Delta V_j M_j$. In the dipole approximation system, since there is no need to execute surface integration on each volume element 51 (FIG. 2A) to be a source point, a calculation load is reduced.

In the above-described example, although the magnetic field is computed using the magnetization M applied to each of a plurality of voxels 50 composing the volume element 51, multipole expansion of a magnetic dipole applied to each of a plurality of voxels 50 to the center position of the volume element 51 after coarse graining may be performed to compute the magnetic field of the observation point Po based on a multipole.

In the dipole approximation system, one observation point Po is disposed corresponding to one volume element 51 after coarse graining, and one voxel 50 before coarse graining becomes one source. For this reason, in a case where n voxels 50 are collected and coarse-grained to one volume element 51, the number of observation points Po becomes 1/n, and the number of sources remains unchanged. As a result, the number of combinations of the sources and the observation points becomes 1/n, whereby a calculation time of a magnetic field substantially decreases in proportion to n.

Comparison of Table Reference System and Dipole Approximation System

In comparison of the table reference system and the dipole approximation system described above, the table reference system is excellent in terms of computation accuracy, and the dipole approximation system is excellent in terms of a calculation load. In computing a magnetic field at an observation point in a region distant from the voxel 50 to be a source, even though the magnetization distributed in the voxel 50 is approximated by the magnetic dipole, sufficient computation accuracy is obtained.

Accordingly, which of the table reference system and the dipole approximation system is applied may be decided based on the distance between the voxel 50 to be a source and the observation point Po. For example, the table reference system may be applied to computation of a magnetic field at an observation point Po inside a sphere having a certain radius around the source, and the dipole approximation system may be applied to computation of a magnetic field at an observation point Po outside the sphere.

Third Function (Iterated Integration System)

Next, the third function (iterated integration system) of the magnetic field calculation unit 23 (FIG. 1) will be described referring to FIG. 6.

Figure 6:
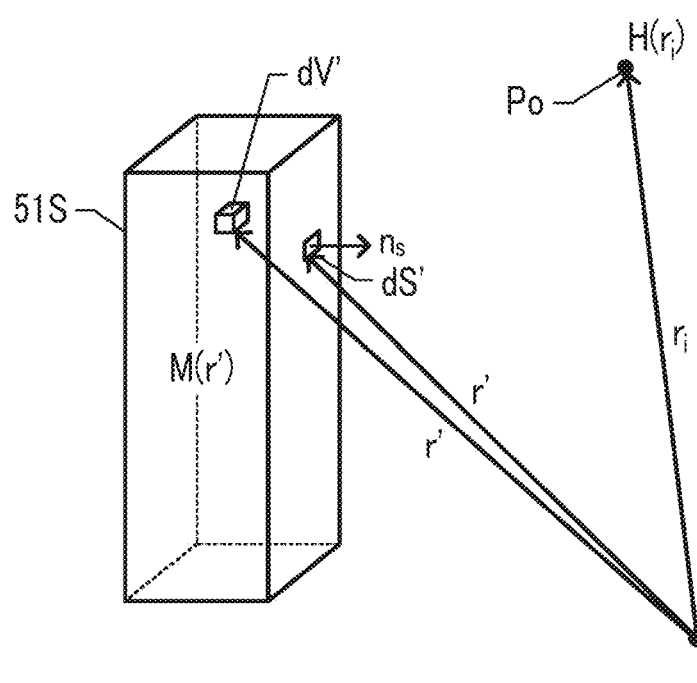
FIG. 6 is a diagram showing a positional relationship between a volume element to be a source point and an observation point Po.

FIG. 6 is a diagram showing a positional relationship between the volume element 51S to be a source and the observation point Po. The observation point Po is set, for example, at the center of each of the volume elements 51. The magnetization at the position r' in the volume element 51S to be a source is represented by M(r'). In a case where the position of the observation point Po is represented by $r_i$, the magnetic field $H(r_i)$ generated at the position of the observation point Po by the magnetization M(r') applied to the volume element 51S to be a source can be computed based on Expression (2). Here, the volume integration of Expression (2) is executed on the microvolume element dV' in the volume element 51S to be a source, and the surface integration is executed on the micro region dS' of the surface of the volume element 51S to be a source.

In a case where it can be assumed that the magnetization M(r') in the volume element 51S is constant or in a case where a spatial change of the magnetization M(r') in the volume element 51S is substantially negligible, the term of the volume integration on the right side of Expression (2) becomes 0. Thus, with the execution of the surface integration on the right side of Expression (2), it is possible to obtain the magnetic field $H(r_i)$.

In the iterated integration system, the magnetic field of the observation point Po is directly computed without averaging the magnetic fields at the positions of the reference points $G_k$ used by the table reference system. For this reason, it is possible to increase the computation accuracy of the magnetic field compared to the table reference system. In particular, when the source point is close to the observation point, an effect of the application of the iterated integration system is remarkable.

Furthermore, in the table reference system, the magnetic field is computed under a condition that the magnetization $M_j$ in the volume element 51S (FIG. 4) to be a source is constant. The iterated integration system can also be applied to a case where the magnetization in the volume element 51 is changed spatially.

In the iterated integration system, one volume element 51 after coarse graining becomes one source, and becomes one observation point. For this reason, in a case where n voxels 50 are collected and coarse-grained to one volume element 51, both of the number of sources and the number of observation points become 1/n. As a result, since the number of combinations of the sources and the observation points becomes $1/n^2$, a calculation time of a magnetic field substantially decreases in proportion to $n^2$.

Next, an example where a magnetic field generated at an observation point Po is computed will be described referring to FIG. 7A.

Figure 7A:
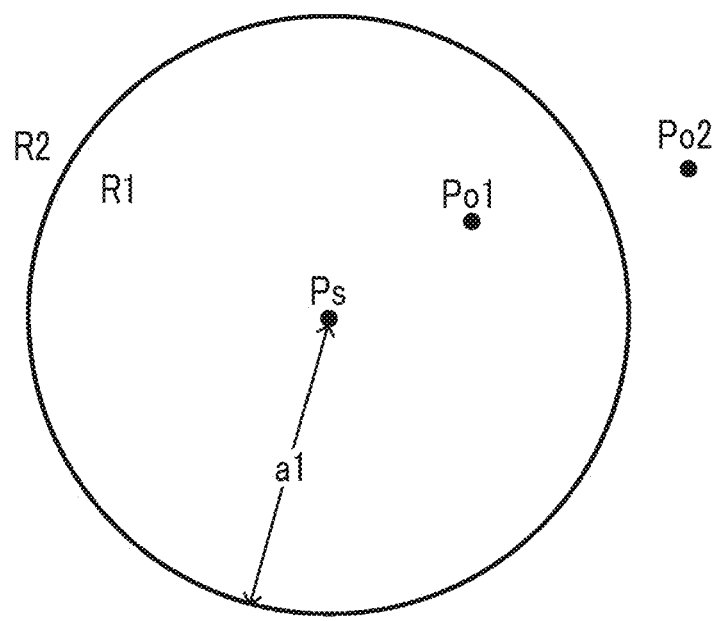
FIGS. 7A and 7B are diagrams showing a positional relationship between a source point and an observation point.

FIG. 7A is a diagram showing a positional relationship between a source Ps and observation points Po1 and Po2. The table reference system is applied to computation of a magnetic field generated at the observation point Po1 in a first region R1 inside a sphere having a radius a1 around the source Ps. With this, it is possible to achieve reduction in calculation load while securing computation accuracy. The dipole approximation system is applied to computation of a magnetic field generated at the observation point Po2 in a second region R2 outside the first region R1. With this, it is possible to further reduce a calculation load while securing computation accuracy.

Next, another example where a magnetic field generated at an observation point Po is computed will be described referring to FIG. 7B.

Figure 7B:
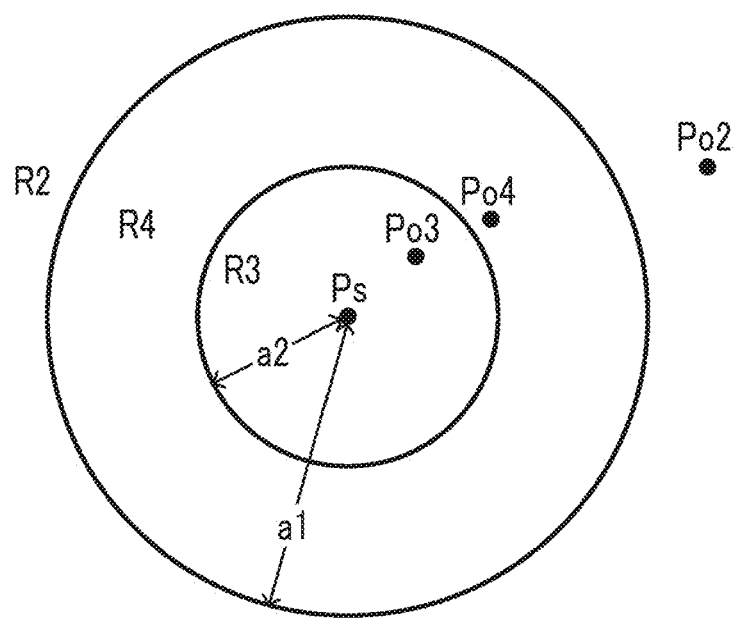

FIG. 7B is a diagram showing a positional relationship between a source Ps and observation points Po2, Po3, and Po4. In the example shown in FIG. 7B, the first region R1 is divided into a third region R3 inside and a fourth region R4 outside a sphere having a radius a2 (a2<a1) around the source Ps. The table reference system is applied to computation of the magnetic field generated at the observation point Po4 in the fourth region R4 as in the example of FIG. 7A. The iterated integration system is applied to computation of the magnetic field generated at the observation point Po3 in the third region R3. With this, it is possible to further increase computation accuracy.

In order to confirm an effect obtained with the use of the magnetic field analysis device according to the embodiment, magnetic field analysis is actually performed. Next, an analysis result will be described referring to FIGS. 8A to 8C.

Figure 8A:
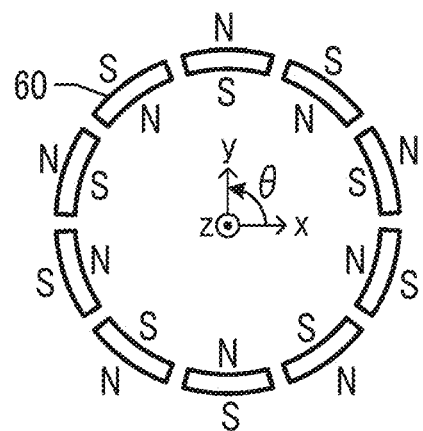
FIGS. 8A and 8B are a plan view and a side view of a permanent magnet that is used in a magnet electric motor to be analyzed, respectively.
Figure 8B:
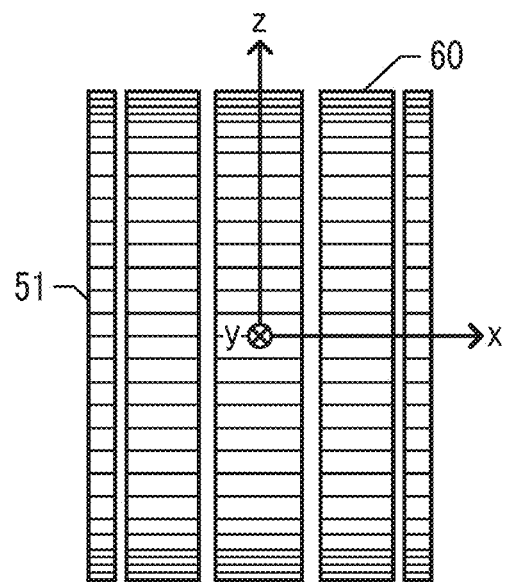

FIGS. 8A and 8B are a plan view and a side view of a permanent magnet that is used in a magnet electric motor to be analyzed, respectively. Ten permanent magnets 60 are arranged at regular intervals in a circumferential direction along a side surface of a column with a z axis as a center axis. A radial direction is defined as an x axis and a y axis. A plain cross section of each of the permanent magnets 60 has an arc shape, and is magnetized in the radial direction. Magnetization directions of two adjacent permanent magnets 60 in a circumferential direction are opposite directions. In the magnetic field analysis, the permanent magnet 60 is divided into a plurality of voxels 50 (FIG. 2A). FIG. 8B shows boundaries in the z-axis direction between volume elements 51 after coarse graining, and boundaries in the x-axis direction and the y-axis direction are not shown.

A change in the z-axis direction of a magnetic field formed by the permanent magnet 60 is moderate compared to changes in the x-axis direction and the y-axis direction. For this reason, coarse graining for collecting a plurality of continuous voxels 50 (FIG. 2A) in the z-axis direction to the volume element 51 (FIG. 2B) is performed. A change of the magnetic field near the center in the z-axis direction is relatively moderate, and changes of the magnetic field near both ends in the z-axis direction become steep. For this reason, the number of voxels 50 collected to one volume element 51 is made relatively large near the center of the permanent magnet 60 in the z-axis direction and is made relatively small near both ends in the z-axis direction. In the magnetic field analysis, the number of voxels 50 is 234,952, and the number of volume elements 51 after coarse graining is 26,064. For comparison, magnetic field analysis has been performed on a comparative example where coarse graining is not performed, that is, each of all volume elements 51 is composed of one voxel 50.

Furthermore, in the magnetic field analysis, the radius a2 of the spherical surface to be the boundary between the third region R3 and the fourth region R4 of FIG. 7B is made four times the length of one side of the voxel 50, and the radius a1 of the spherical surface to be the boundary between the fourth region R4 and the second region R2 is made 16 times the length of one side of the voxel 50.

Figure 8C:
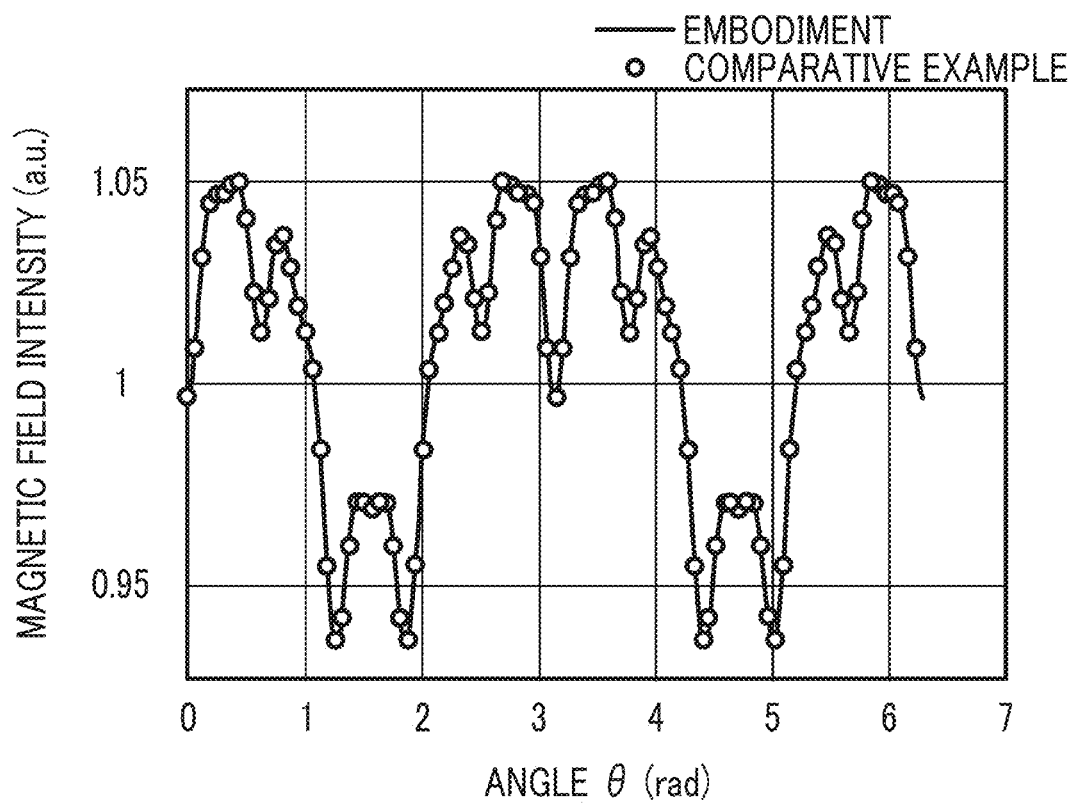
FIG. 8C is a graph showing a result of magnetic field analysis using a method according to the embodiment and a result of magnetic field analysis using a method according to a comparative example.

FIG. 8C is a graph showing a result of magnetic field analysis using the method according to the embodiment and a result of magnetic field analysis using the method according to the comparative example. The horizontal axis represents an angle in a rotation direction around the z axis by "radian", and the vertical axis represents the intensity of the magnetic field by any unit. In the graph of FIG. 8C, the intensity of the magnetic field on the surface of the permanent magnet 60 in the middle in the z-axis direction is shown. A solid line in the graph indicates a magnetic field analysis result according to the embodiment, and a circle symbol indicates a magnetic field analysis result according to the comparative example.

As shown in FIG. 8C, the magnetic field analysis results of the embodiment and the comparative example coincide with each other well. This means that sufficient computation accuracy is obtained even though coarse graining is performed. A computation time when the magnetic field analysis is performed using the method according to the comparative example is 33.9 times a computation time when the magnetic field analysis is performed using the method according to the embodiment. With coarse graining, it is confirmed that a calculation load can be reduced and reduction in magnetic field analysis time can be achieved.

Application of Multipole Expansion to Dipole Approximation System

Next, a method that applies multipole expansion to computation of the magnetic field using the dipole approximation system to achieve reduction in computation time will be described referring to FIGS. 9 to 12.

Figure 9:
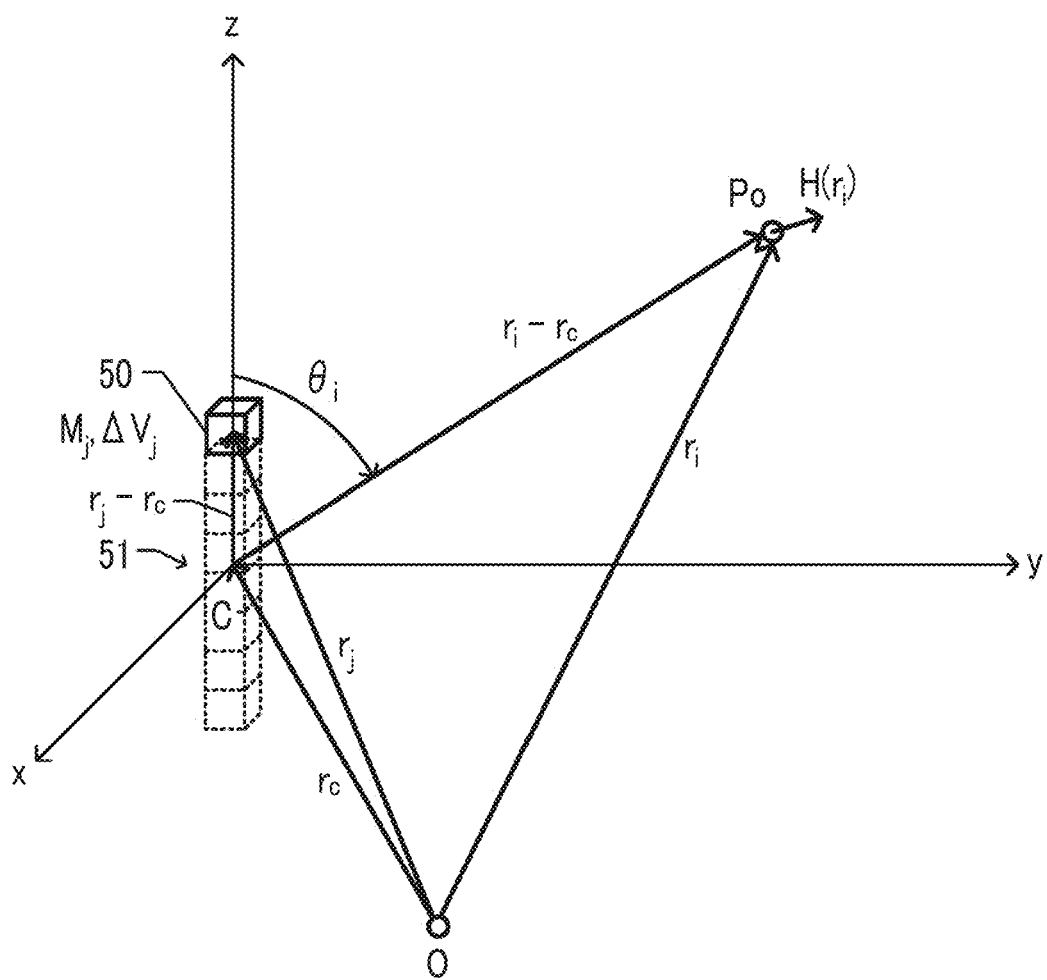
FIG. 9 is a diagram showing a coordinate system that is used to illustrate a method of multipole expansion.

FIG. 9 is a diagram showing a coordinate system that is used for illustrating a method of multipole expansion. A plurality of cubic voxels 50 arranged in a line in a direction in which a change of a magnetic field is relatively moderate are coarse-grained to obtain one volume element 51. The number of a plurality of voxels 50 to be multipole-expanded is represented by N. The position of the center of the coarse-grained volume element 51 is represented by $r_c$. The position $r_c$ is referred to as a multipole expansion point C. An xyz rectangular coordinate system where the multipole expansion point C is the origin, and the direction in which the change of the magnetic field is relatively moderate is the z-axis direction is defined. A plurality of voxels 50 each having a magnetic dipole multipole-expanded to the multipole expansion point C are positioned on the z axis. In the xyz rectangular coordinate system, a position of a j-th voxel 50 is represented by $r_j - r_c$, and a position of an observation point Po is represented by $r_i - r_c$. Magnetization applied to the j-th voxel 50 is represented by $M_j$, and the volume of the j-th voxel 50 is represented by $\Delta V_j$. An angle between the z axis and a vector $r_i - r_c$ from the multipole expansion point C toward the observation point Po is represented by $\theta_i$.

A distance $r_{ij}$ between the j-th voxel 50 and the observation point Po is represented by Expression (8) described below.

$$\frac{1}{r_{ij}} = \frac{1}{\sqrt{r_{ic}^2 + r_{jc}^2 + 2r_{ic}r_{jc}\cos\theta_i}} = \sum_{L=0}^{\infty} \frac{r_{jc}^L}{r_{ic}^{L+1}} P_L(\cos\theta_i) \quad (8)$$

Here, $r_{ic}$ and $r_{jc}$ are a distance between the multipole expansion point C and the observation point Po and a distance between the multipole expansion point C and the j-th voxel 50, respectively. $P_L(\cos\theta_i)$ is an L-th order Legendre polynomial with $\cos\theta_i$ as an argument. Expression (8) is described in J. D. JACKSON, CLASSICAL ELECTRODYNAMICS THIRD EDITION, p. 103.

In a case where Expression (8) is partially differentiated by $x_{ic}$, which is an x component of the vector $r_i - r_c$, Expression (9) described below is obtained.

$$-\frac{x_{ic} + 2x_{jc}}{(r_{ic}^2 + r_{jc}^2 + 2r_{ic} \cdot r_{jc})^{\frac{3}{2}}} = \quad (9)$$

$$\sum_{L=0}^{\infty} \left[ -(L+1)\frac{r_{jc}^L x_{ic}}{r_{ic}^{L+3}} P_L(\cos\theta_i) + \frac{r_{jc}^L}{r_{ic}^{L+1} r_{jc}} \left\{ \frac{x_{jc}}{r_{ic}} - \frac{x_{ic}(r_{ic} \cdot r_{jc})}{r_{ic}^3} \right\} \right.$$

$$\left. \frac{\partial P_L(\cos\theta_i)}{\partial \cos\theta_i} \right] = \sum_{L=0}^{\infty} \left[ -(L+1)\frac{x_{ic}}{r_{ic}^{L+3}} r_{jc}^L P_L(\cos\theta_i) + \right.$$

$$\left. \frac{1}{r_{ic}^{L+2}} \left\{ r_{jc}^{L-1} x_{jc} - \frac{x_{ic} r_{jc}^{L-1} (r_{ic} \cdot r_{jc})}{r_{ic}^2} \right\} \frac{\partial P_L(\cos\theta_i)}{\partial \cos\theta_i} \right]$$

Here, $r_{ic} = r_i - r_c$ and $r_{jc} = r_j - r_c$. $x_{jc}$ is an x component of a position vector $r_{jc}$.

Since the j-th voxel 50 is positioned on the z axis, $x_{jc} = y_{jc} = 0$. In a case where this condition is applied to Expression (9), Expression (10) described below is derived.

$$\frac{1}{(r_{ic}^2 + r_{jc}^2 + 2r_{ic} \cdot r_{jc})^{\frac{3}{2}}} = \quad (10)$$

$$\sum_{L=0}^{\infty} \left[ g_1 P_L(\cos\theta_i) |z_{jc}|^L + g_2 \frac{\partial P_L(\cos\theta_i)}{\partial \cos\theta_i} |z_{jc}|^{L-1} z_{jc} \right]$$

Here, $g_1$ and $g_2$ are represented by the following expressions.

$$g_1 = \frac{L+1}{r_{ic}^{L+3}} \quad (11)$$

$$g_2 = \frac{z_{ic}}{r_{ic}^{L+4}}$$

Furthermore, $z_{jc}$ is a z component of the vector $r_{jc}$.

In a case where Expression (10) is partially differentiated by $x_{ic}$, and then, is divided by $-x_{ic}$, the following expression is obtained.

$$\frac{3}{(r_{ic}^2 + r_{jc}^2 + 2r_{ic} \cdot r_{jc})^{\frac{5}{2}}} = \sum_{L=0}^{\infty} \Big[ f_1 P_L(\cos\theta_i) |z_{jc}|^L + \quad (12)$$
$$f_2 \frac{\partial P_L(\cos\theta_i)}{\partial \cos\theta_i} |z_{jc}|^{L-1} z_{jc} + f_3 \frac{\partial^2 P_L(\cos\theta_i)}{\partial \cos\theta_i^2} |z_{jc}|^L \Big]$$

Here, $f_1$, $f_2$, and $f_3$ are represented by the following expressions.

$$f_1 = \frac{(L+1)(L+3)}{r_{ic}^{L+5}} \quad (13)$$

$$f_2 = \frac{(2L+5)}{r_{ic}^{L+6}} z_{ic}$$

$$f_3 = \frac{z_{ic}^2}{r_{ic}^{L+7}}$$

A magnetic field $H(r_i)$ that is formed at the distant observation point Po by the j-th voxel 50 having a magnetic moment $m_j$ can be approximated by the following expressions.

$$4\pi H(r_i) = \left[ \frac{3r_{ij}(m_i \cdot r_{ij})}{r_{ij}^5} - \frac{m_j}{r_{ij}^3} \right] \quad (14)$$

$$m_j = M_j \cdot \Delta V_j$$

Here, $M_j$ and $\Delta V_j$ are the magnetization applied to the j-th voxel 50 and the volume of the j-th voxel 50, respectively. A magnetic field that is formed at the distant observation point Po by the volume element 51, in which N voxels 50 are coarse-grained, is obtained by summing up Expression (14) on the N voxels 50. In a case where Expression (14) is summed up on the N voxels 50, Expression (7) is obtained.

In a case where Expressions (10) and (12) are substituted into Expression (14) and arranged, the following expression is obtained.

$$4\pi H(r_i) = \frac{3r_{ij}(m_j \cdot r_{ij})}{r_{ij}^5} - \frac{m_j}{r_{ij}^3} = \quad (15)$$

$$r_{ic}(m_j \cdot r_{ic}) \sum_{L=0}^{\infty} \Big[ f_1 P_L(\cos\theta_i)|z_{jc}|^L + f_2 \frac{\partial P_L(\cos\theta_i)}{\partial \cos\theta_i}|z_{jc}|^{L-1} z_{jc} +$$

$$f_3 \frac{\partial^2 P_L(\cos\theta_i)}{\partial \cos\theta_i^2}|z_{jc}|^L \Big] - r_{ic} m_{jz} \sum_{L=0}^{\infty} \Big[ f_1 P_L(\cos\theta_i)|z_{jc}|^L z_{jc} +$$

$$f_2 \frac{\partial P_L(\cos\theta_i)}{\partial \cos\theta_i}|z_{jc}|^{L+1} + f_3 \frac{\partial^2 P_L(\cos\theta_i)}{\partial \cos\theta_i^2}|z_{jc}|^L z_{jc} \Big] -$$

$$m_j \sum_{L=0}^{\infty} \Big[ g_1 P_L(\cos\theta_i)|z_{jc}|^L + g_2 \frac{\partial P_L(\cos\theta_i)}{\partial \cos\theta_i}|z_{jc}|^{L-1} z_{jc} \Big] -$$

-continued $$\left\{ (m_j \cdot r_{ic}) \sum_{L=0}^{\infty} \Big[ f_1 P_L(\cos\theta_i)|z_{jc}|^L + f_2 \frac{\partial P_L(\cos\theta_i)}{\partial \cos\theta_i}|z_{jc}|^{L-1} z_{ic} z_{jc} + f_3 \frac{\partial^2 P_L(\cos\theta_i)}{\partial \cos\theta_i^2}|z_{jc}|^L \Big] \right\} + $$

$$\left\{ m_{jz} \sum_{L=0}^{\infty} \Big[ f_1 P_L(\cos\theta_i)|z_{jc}|^{L+2} + f_2 \frac{\partial P_L(\cos\theta_i)}{\partial \cos\theta_i}|z_{jc}|^{L+1} z_{ic} z_{jc} + f_3 \frac{\partial^2 P_L(\cos\theta_i)}{\partial \cos\theta_i^2}|z_{jc}|^{L+2} \Big] \right\}$$

Here, first, second, and third expressions in a curly bracket represent an x component, a y component, and a z component, respectively. $m_{jz}$ is a z component of the magnetic moment $m_j$.

It is assumed that the magnetic moments $m_j$ corresponding to the N voxels 50 before coarse graining are equal. In this case, $m_1 = m_2 = \ldots = m_N = m$ can be represented. Furthermore, it is assumed that the lengths d of one side of the N voxels 50 before coarse graining are equal. In a case where the length of one side of the j-th voxel 50 is represented by $d_j$, $d_1 = d_2 = \ldots = d_N = d$ can be represented. Considering contribution of the N voxels to the observation point Po, the following expression is derived from Expression (15).

$$4\pi H(r_i) = \quad (16)$$

$$r_{ic}(m \cdot r_{ic}) \sum_{L=0}^{\infty} \Big[ s_1^{2L} \Big\{ f_1 P_{2L}(\cos\theta_i) + f_2 \frac{\partial P_{2L}(\cos\theta_i)}{\partial \cos\theta_i} + f_3 \frac{\partial^2 P_{2L}(\cos\theta_i)}{\partial \cos\theta_i^2} \Big\} \Big] -$$

$$r_{ic} m_z \sum_{L=0}^{\infty} \Big[ s_2^{2L+1}$$

$$\Big\{ f_1 P_{2L+1}(\cos\theta_i) + f_2 \frac{\partial P_{2L+1}(\cos\theta_i)}{\partial \cos\theta_i} + f_3 \frac{\partial^2 P_{2L+1}(\cos\theta_i)}{\partial \cos\theta_i^2} \Big\} \Big] -$$

$$m \sum_{L=0}^{\infty} \Big[ s_1^{2L} \Big\{ g_1 P_{2L}(\cos\theta_i) + g_2 \frac{\partial P_{2L}(\cos\theta_i)}{\partial \cos\theta_i} \Big\} \Big] -$$

$$\left\{ (m \cdot r_{ic}) \sum_{L=0}^{\infty} \Big[ s_2^{2L+1} \Big\{ f_1 P_{2L+1}(\cos\theta_i) + f_2 \frac{\partial P_{2L+1}(\cos\theta_i)}{\partial \cos\theta_i} + f_3 \frac{\partial^2 P_{2L+1}(\cos\theta_i)}{\partial \cos\theta_i^2} \Big\} \Big] \right\} +$$

$$\left\{ m_z \sum_{L=0}^{\infty} \Big[ s_3^{2L} \Big\{ f_1 P_{2L}(\cos\theta_i) + f_2 \frac{\partial P_{2L}(\cos\theta_i)}{\partial \cos\theta_i} + f_3 \frac{\partial^2 P_{2L}(\cos\theta_i)}{\partial \cos\theta_i^2} \Big\} \Big] \right\}$$

Here, $m_z$ is a z component of a magnetic moment m. Coefficients $s_1^L$, $s_2^L$, and $s_3^L$ are defined by the following expressions.

$$s_1^L = 2 \sum_{j=1}^{\frac{N}{2}} (jd)^L \qquad (17)$$

$$s_2^L = 2 \sum_{j=1}^{\frac{N}{2}} (jd)^{L+1}$$

$$s_3^L = 2 \sum_{j=1}^{\frac{N}{2}} (jd)^{L+2}$$

In a case where a plurality of voxels 50 to be coarse-grained are arranged only in the z-axis direction, and the length $d_j$ of one side is identical in all voxels 50, the coefficients $s_1^L$, $s_2^L$, and $s_3^L$ shown in Expression (17) can be computed in a stage of defining the volume element 51 by coarse-graining the voxels 50. In Expression (16), $r_{ij}$ does not appear as a position vector, and only $r_{ic}$ appears. For this reason, the magnetic field formed at the observation point Po by the volume element 51 after coarse graining can be computed using the position $r_c$ of the multipole expansion point C and the position $r_i$ of the observation point Po. This means that, in computing the magnetic field at the observation point Po, there is no need to individually handle the N voxels 50 before coarse graining. Accordingly, it is possible to reduce a computation time compared to a method that computes the magnetic field for the position $r_j$ of each of the N voxels 50.

Therefore, with the use of a method of multipole expansion of the magnetic dipole of each of a plurality of voxels 50 arranged in a line in one direction (z-axis direction), in which the change of the magnetic field is relatively moderate, to the multipole expansion point C, it is possible to reduce a computation time. In order to achieve reduction in computation time, it is preferable that a simulation condition is set so as to satisfy conditions that the lengths $d_j$ of one side of a plurality of N voxels 50 coarse-grained in one volume element 51 are equal and the magnetization $M_j$ applied to each of the N voxels 50 is equal.

The values of the coefficients $s_1^L$, $s_2^L$, and $s_3^L$ may be computed in advance until an expansion order of a Legendre polynomial that is used when simulation computation is actually performed and may be stored in the storage device 25 (FIG. 1).

Next, a result of an evaluation experiment performed in order to confirm an effect of using the multipole expansion method will be described. Magnetic field computation using the multipole expansion method and magnetic field computation in which dipole approximation is applied to the individual voxel 50 have been actually performed and have been compared in terms of the accuracy and the computation time.

Figure 10A:
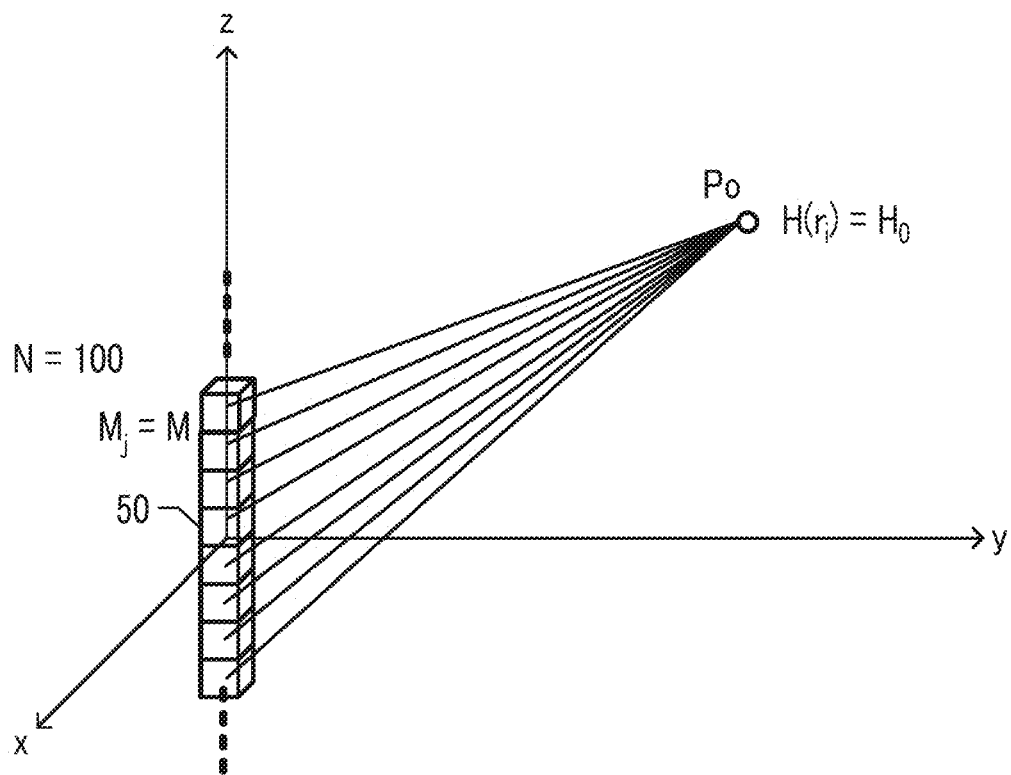
FIG. 10A is a diagram illustrating a method that performs dipole approximation on an individual voxel and obtains a magnetic field $H(r_i)$ generated at the observation point Po by computation.

FIG. 10A is a diagram illustrating a method of performing dipole approximation on the individual voxel 50 and obtaining the magnetic field $H(r_i)$ generated at the observation point Po by computation. 100 voxels 50 are arranged in the z-axis direction. Magnetization M is applied to each of the voxels 50. A magnetic field generated at the observation point Po by the individual voxel 50 has been obtained, and the magnetic field $H(r_i)$ has been obtained by summing up the magnetic field on the 100 voxels 50. The magnetic field obtained by the computation is written as Ho.

Figure 10B:
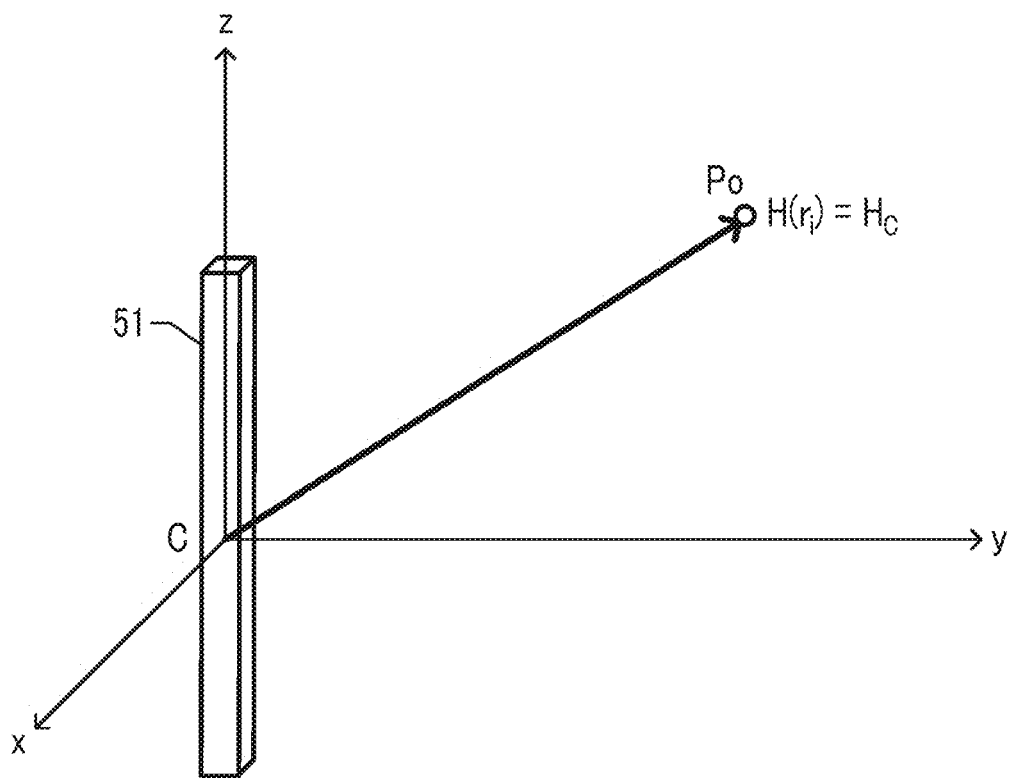
FIG. 10B is a diagram illustrating a method that uses a multipole expansion method and obtains the magnetic field $H(r_i)$ generated at the observation point Po by computation.

FIG. 10B is a diagram illustrating a method of using the multipole expansion method and obtaining the magnetic field $H(r_i)$ generated at the observation point Po by computation. The volume element 51 has been defined by coarse-graining the 100 voxels 50 (FIG. 10A), and multipole expansion of the magnetic moments of the 100 voxels 50 to the multipole expansion point C as the center of the volume element 51 has been performed. The length of one side of each of the cubic voxels 50 is represented by d. In this case, a coarse graining scale becomes 100 d. The coefficients $s_1^L$, $s_2^L$, and $s_3^L$ have been computed in advance using Expression (17), and the magnetic field $H(r_i)$ at the observation point Po has been obtained using Expression (16). The magnetic field obtained by the computation is written as Hc. The computation of the magnetic field Hc has been performed on three cases where the expansion order of the Legendre polynomial is set to a zero order, a second order, and a fourth order.

Figure 11:
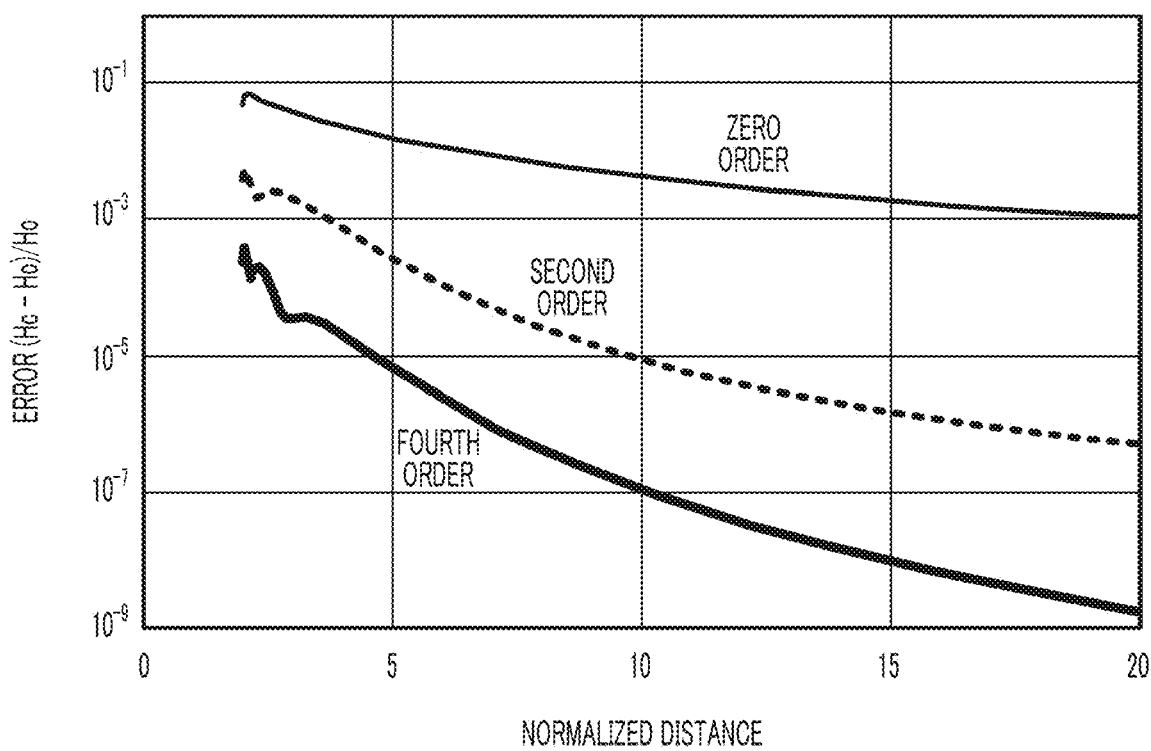
FIG. 11 is a graph showing an error of a magnetic field Hc with respect to a magnetic field Ho as a function of a normalized distance.

FIG. 11 is a graph showing an error of the magnetic field Hc with respect to the magnetic field Ho as a function of a normalized distance. The normalized distance is obtained by normalizing the distance between the multipole expansion point C and the observation point Po on a coarse graining scale 100 d. The error is defined by (Hc−Ho)/Ho. A thin solid line, a broken line, and a thick solid line shown in the graph of FIG. 11 indicate errors in a case where the expansion order of the Legendre polynomial is the zero order, the second order, and the fourth order, respectively.

It is understood that the higher the expansion order of the Legendre polynomial, the smaller the error. Furthermore, it is understood that the longer the normalized distance, the smaller the error. As shown in FIGS. 7A and 7B, in a case where the iterated integration system or the table reference system is used in a range in which the distance between the source Ps and the observation point Po is short, the dipole approximation system is applied in a range distant from the source Ps to a certain degree. For this reason, it is considered that, even though the expansion order of the Legendre polynomial is set to be low, sufficiently high accuracy is obtained.

Figure 12:
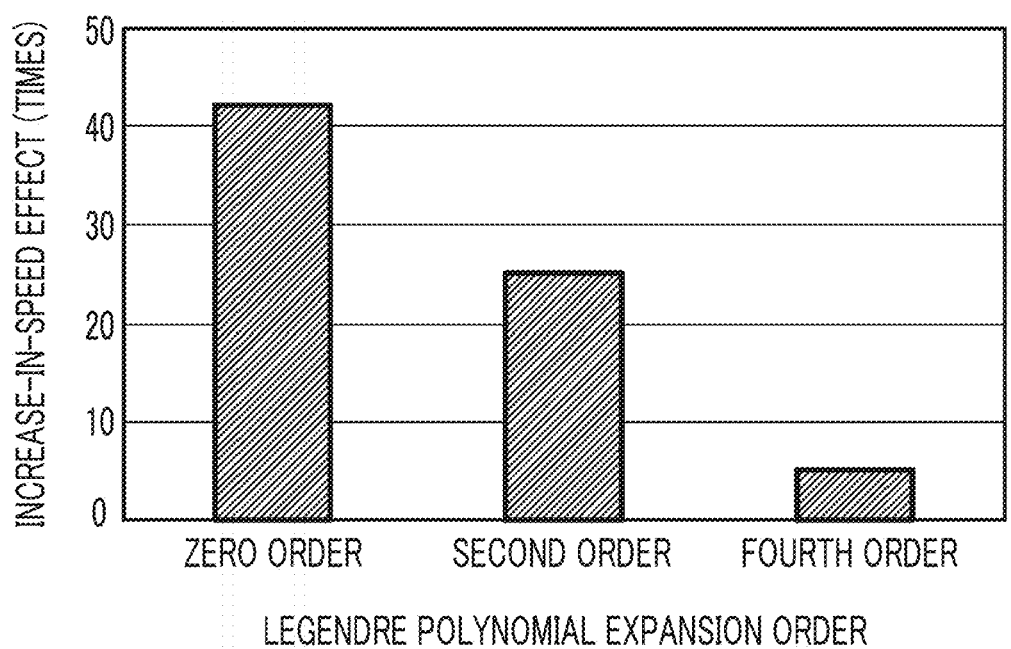
FIG. 12 is a graph showing an increase-in-speed effect of computation with multipole expansion.

FIG. 12 is a graph showing an increase-in-speed effect of computation with multipole expansion. When a computation time in a case where a method (FIG. 10A) that performs dipole approximation on the individual voxel 50 is applied is represented by $T_O$, and a computation time in a case where the multipole expansion method is applied is represented by $T_C$, the increase-in-speed effect is defined as $T_O/T_C$. For example, in a case where the computation time $T_C$ becomes ½ of the computation time $T_O$, the increase-in-speed effect is two times.

It is understood that each time the expansion order of the Legendre polynomial is set to be low, the increase-in-speed effect becomes high. In a case where the expansion order of the Legendre polynomial is set to the second order, the increase-in-speed effect of about 25 times is obtained. Furthermore, even though the expansion order of the Legendre polynomial is set to the fourth order, the increase-in-speed effect of about five times is obtained.

With the evaluation experiments shown in FIGS. 11 and 12, it has been confirmed that the application of the multipole expansion method enables reduction in computation time while maintaining desired accuracy. In a case where the expansion order of the Legendre polynomial is set to be low, a computation time becomes short; however, accuracy is degraded. The expansion order of the Legendre polynomial may be decided according to required accuracy and an allowed computation time.

As shown in FIG. 11, in a case where the normalized distance becomes long, high accuracy is obtained even though the expansion order of the Legendre polynomial is set to be low. For this reason, the expansion order of the Legendre polynomial may be changed according to the normalized distance. As the normalized distance becomes long, the expansion order of the Legendre polynomial may be set to be low. With the method, it is possible to further reduce a computation time while maintaining required accuracy.

Next, a modification example of the above-described embodiment will be described.

In the above-described embodiment, a case where the change of the magnetic field relating to the z-axis direction shown in FIG. 2B is more moderate than the changes of the magnetic fields relating to the x-axis direction and the y-axis direction has been described. The example corresponds to a case where a magnetized object has a rod shape or a cylindrical shape that is long in the z-axis direction. In addition, in a case where the magnetized object has a plate shape that spreads within an xy plane, the changes of the magnetic fields relating to the x-axis direction and the y-axis direction become more moderate than the change of the magnetic field relating to the z-axis direction. In such a case, the volume element 51 may be made to have the dimension in the x-axis direction and the y-axis direction greater than the dimension in the z-axis direction.

The analysis method according to the above-described embodiment can also be applied to a method (magnetic bead method) that disposes spherical beads inscribed inside the voxels 50 (FIG. 2A), applies magnetization (magnetic moment) to the beads, and simulates the movement of a magnetic material having an aggregate of the beads. The magnetic bead method is described in the related art.

In a case where the volume $\Delta V_j$ shown in Expression (7) is considered as the volume of the magnetic bead, the volume of the voxel 50 is represented by $\Delta V_j/\gamma_j$ using a filling rate $\gamma_j$ of the magnetic bead. Accordingly, in a case where the method according to the embodiment is applied to the magnetic bead method, $\Delta V_j/\gamma_j$, instead of $\Delta V_j$ of Expression (7), may be used.

In the simulation shown in FIGS. 8A to 8C, although an example where the permanent magnet of the magnet electric motor is magnetized has been handled, the analysis method according to the above-described embodiment can be used in magnetic field analysis of other electromagnetic actuators. Furthermore, even though the object is a ferromagnetic material, such as iron, not the permanent magnet, the analysis method according to the above-described embodiment can be applied. In this case, magnetization generated by an external magnetic field may be applied to each voxel 50 (FIG. 2A), and a magnetic field by the magnetization may be obtained.

In the above-described embodiment, although the analysis object is divided into the voxels 50 (FIG. 2A), and a plurality of continuous voxels 50 are coarse-grained to form the volume element 51, the analysis object may be directly divided into the volume elements 51 without using the voxels 50.

In the above-described embodiment, although one observation point is set in one volume element 51 (FIG. 2B), a plurality of observation points may be set in one volume element 51 or an observation point may be set in each voxel 50. In a case where a plurality of observation points are set in one volume element 51, and magnetization is produced based on a magnetic field generated at each observation point, a distribution of the magnetization occurs in one volume element 51. In a case where the table reference system is applied, a magnetic field may be computed using a magnetization $M_j$ obtained by averaging the distribution of the magnetization in one volume element 51. In a case where the dipole approximation system is applied, the magnetization $M_j$ of each voxel 50 (FIG. 5) to be a source may be obtained from the magnetic field at the observation point. In a case where the iterated integration system is applied, the magnetic field at the observation point may be computed based on the magnetization $M(r')$ that is not uniform in the volume element 51 to be a source.

It should be understood that the above-described embodiment is an example and partial replacement or a combination of the configurations shown in different embodiments is possible. The same advantageous effect by the same configuration in a plurality of embodiments is not consecutively mentioned for each embodiment. In addition, the invention is not limited to the above-described embodiment. For example, it will be obvious to those skilled in the art that various alterations, improvements, combinations, and the like can be made.

It should be understood that the invention is not limited to the above-described embodiment, but may be modified into various forms on the basis of the spirit of the invention. Additionally, the modifications are included in the scope of the invention.

What is claimed is:

1. A magnetic field analysis device comprising:
a processing device including a magnetization application unit and a magnetic field calculation unit, the processing device configured to:
divide, by the magnetization application unit, a virtual space into a plurality of volume elements and applies magnetization to each of the plurality of volume elements; and
calculate, by the magnetic field calculation unit, on each of a plurality of observation points in the virtual space, based on the magnetization applied to a portion of the plurality of volume elements around the observation point, a magnetic field generated at the observation point for each volume element and obtain a magnetic field generated at each of the plurality of observation points based on a calculation result of the each of the plurality of volume elements,
wherein the processing device, with the magnetization application unit, is further configured to
divide the virtual space into a plurality of voxels having the same shape and dimension,
apply magnetization to each of the plurality of voxels,
perform coarse graining for collecting a plurality of continuous voxels in a first direction to one volume element to make dimension relating to the first direction greater than dimension relating to a second direction and a third direction on at least a part of the plurality of volume elements, and
apply magnetization to each of the coarse-grained volume elements based on the magnetization applied to the plurality of voxels included in the each of the coarse-grained volume elements.

2. The magnetic field analysis device according to claim 1, further comprising:
a correspondence relationship holding unit that holds a correspondence relationship between the magnetization applied to the each of the plurality of volume elements and a magnetic field generated at the each of the plurality of observation points around the volume element for each relative position of the volume element and the observation point, wherein the magnetic field calculation unit has a first function of obtaining the magnetic field generated at the observation point by the magnetization applied to the volume element using the correspondence relationship.

3. The magnetic field analysis device according to claim 2, wherein the correspondence relationship holding unit holds the correspondence relationship for each size of the plurality of volume elements, and in computing the magnetic field generated at the each of the plurality of observation points by the magnetization applied to the each of the plurality of volume elements, the magnetic field calculation unit computes the magnetic field using the correspondence relationship corresponding to the size of the volume element to be a source for generating a magnetic field.

4. The magnetic field analysis device according to claim 2, wherein the magnetic field calculation unit has a second function of obtaining the magnetic field at the observation point based on a magnetic dipole by representing the magnetization applied to each of the plurality of voxels with the magnetic dipole.

5. The magnetic field analysis device according to claim 4, wherein the second function includes a function of obtaining the magnetic field generated at the observation point by the magnetic dipole of each of the plurality of voxels for each voxel and summing up the magnetic field obtained for the each voxel.

6. The magnetic field analysis device according to claim 4, wherein the second function includes a function of performing multipole expansion of the magnetic dipole of each of the plurality of voxels arranged in a line in one direction to one multipole expansion point and obtaining the magnetic field of the observation point based on a relative position of the observation point with respect to the one multipole expansion point.

7. The magnetic field analysis device according to claim 6, wherein a plurality of the magnetic dipoles multipole-expanded to the one multipole expansion point have the same magnitude and direction, and a portion of the plurality of voxels corresponding to the plurality of the magnetic dipoles multipole-expanded to the one multipole expansion point have the same dimension.

8. The magnetic field analysis device according to claim 4, wherein the magnetic field calculation unit obtains the magnetic field generated at each of at least a part of the plurality of observation points, of which a distance between the volume element to be a source for generating a magnetic field and the observation point is equal to or less than a first distance, using the first function, and obtains the magnetic field generated at the each of the plurality of observation points at a distance longer than the first distance using the second function.

9. The magnetic field analysis device according to claim 8, wherein the magnetic field calculation unit has a third function of performing surface integration of a physical quantity including the magnetization applied to the volume element to be the source for generating the magnetic field on a surface of the volume element to obtain the magnetic field generated at the each of the plurality of observation points around the volume element.

10. The magnetic field analysis device according to claim 9, wherein the magnetic field calculation unit obtains the magnetic field generated at the each of the plurality of observation points, of which a distance between the volume element to be the source for generating the magnetic field and the observation point is equal to or less than a second distance shorter than the first distance, using the third function.

11. A magnetic field analysis method comprising:

dividing a virtual space into a plurality of volume elements;

applying magnetization to each of the plurality of volume elements;

computing a magnetic field generated at each of a plurality of observation points in the virtual space by the magnetization applied to the plurality of volume elements for each volume element; and obtaining a magnetic field generated at each of the plurality of observation points based on a computation result of the each of the plurality of volume elements, wherein dividing the virtual space into the plurality of volume elements and applying magnetization to the each of the plurality of volume elements further includes dividing the virtual space into a plurality of voxels having the same shape and dimension, applying magnetization to each of the plurality of voxels, performing coarse graining for collecting a plurality of continuous voxels in a first direction to one volume element is performed to make dimension relating to the first direction in the virtual space greater than dimension relating to a second direction and a third direction on at least a part of the plurality of volume elements, and applying magnetization to each of the coarse-grained volume elements based on the magnetization applied to the plurality of voxels included in the each of the coarse-grained volume elements.

12. A non-transitory computer-readable medium storing a program that, when executed by an electronic processor, causes the electronic processor to perform a set of operations, the set of operations comprising:

dividing a virtual space into a plurality of volume elements;

applying magnetization to each of the plurality of volume elements;

computing a magnetic field generated at each of a plurality of observation points in the virtual space by the magnetization applied to the plurality of volume elements for each volume element; and obtaining a magnetic field generated at each of the plurality of observation points based on a computation result of the each of the plurality of volume elements, wherein in dividing the virtual space into the plurality of volume elements, making dimension relating to a first direction in the virtual space greater than dimension relating to a second direction and a third direction on at least a part of the plurality of volume elements, wherein dividing the virtual space into the plurality of volume elements and applying the magnetization to the each of the plurality of volume elements includes
dividing the virtual space into a plurality of voxels having the same shape and dimension,
applying magnetization to each of the plurality of voxels,
performing coarse graining for collecting a plurality of continuous voxels in the first direction to one volume element to make dimension relating to the first direction greater than dimension relating to the second direction and the third direction on at least a part of the plurality of volume elements, and
applying magnetization to each of the coarse-grained volume elements based on the magnetization applied to the plurality of voxels included in each of the coarse-grained volume elements.

* * * * *